US011624758B2

(12) United States Patent
Lei et al.

(10) Patent No.: US 11,624,758 B2
(45) Date of Patent: Apr. 11, 2023

(54) TEST KIT FOR TESTING A DEVICE UNDER TEST

(71) Applicant: MEDIATEK INC., Hsin-Chu (TW)

(72) Inventors: Sheng-Wei Lei, Hsinchu (TW); Chang-Lin Wei, Hsinchu (TW); Ying-Chou Shih, Hsinchu (TW); Yeh-Chun Kao, Hsinchu (TW); Yen-Ju Lu, Hsinchu (TW); Po-Sen Tseng, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 17/211,738

(22) Filed: Mar. 24, 2021

(65) Prior Publication Data

US 2021/0302467 A1    Sep. 30, 2021

Related U.S. Application Data

(60) Provisional application No. 62/994,945, filed on Mar. 26, 2020.

(51) Int. Cl.
*G01R 1/04*      (2006.01)
*H04B 17/29*    (2015.01)

(52) U.S. Cl.
CPC .......... *G01R 1/045* (2013.01); *G01R 1/0466* (2013.01); *H04B 17/29* (2015.01)

(58) Field of Classification Search
CPC ....... G01R 1/045; G01R 1/0466; H04B 17/29
See application file for complete search history.

(56) References Cited

U.S. PATENT DOCUMENTS

| 2017/0279491 | A1* | 9/2017 | Lam ........................ H04B 3/52 |
| 2018/0003754 | A1 | 1/2018 | Schrattenecker |
| 2019/0068300 | A1 | 2/2019 | Lu |
| 2019/0310314 | A1 | 10/2019 | Liu |
| 2021/0072307 | A1 | 3/2021 | Fang |

FOREIGN PATENT DOCUMENTS

| TW | 201913133 A | 4/2019 | |
| WO | WO-2008075010 A1 * | 6/2008 | ............ B82Y 30/00 |
| WO | 2019/133097 A1 | 7/2019 | |

* cited by examiner

*Primary Examiner* — Paresh Patel
(74) *Attorney, Agent, or Firm* — Winston Hsu

(57) ABSTRACT

A test kit for testing a device under test (DUT) includes a socket structure for containing the DUT. The DUT includes an antenna and radiates a RF signal. The test kit further includes a reflector having a lower surface. The RF signal emitted from the antenna of the DUT is reflected by the reflector and a reflected RF signal is received by the antenna of the DUT.

30 Claims, 8 Drawing Sheets

TEST KIT FOR TESTING A DEVICE UNDER TEST

CROSS REFERENCE TO RELATED APPLICATIONS

This application claims priority from U.S. provisional application No. 62/994,945 filed on Mar. 26, 2020, the disclosure of which is included in its entirety herein by reference.

BACKGROUND

This invention relates generally to the field of semiconductor testing. More particularly, this invention relates to an improved test kit (or assembly) for testing electronic devices or modules having or using millimeter wave (mmW) antennas.

As shown in the art, 5G wireless networks support operation at very high frequency bands such as millimeter wave (mmW) frequency bands (generally, wavelengths of 1 mm to 10 mm, or 10 to 300 GHz). Transmitting at the mmW frequency bands places high demands on testing electronic devices to ensure that the transmission and receiving circuitry is operating correctly. In order to inspect the electrical properties of a device under test (DUT), the DUT is stably electrically connected to a test apparatus. In general, a test socket is used as a tool for electrically connecting the DUT and the test apparatus.

Drawbacks of current testing systems include longer test times and large physical size of test systems. It is desired to have a reliable and cost effective test system for testing mmW devices in high volumes.

SUMMARY

It is one object of the invention to provide an improved test kit for testing a DUT to solve the above-mentioned deficiencies or shortcomings.

According to one aspect of the invention, a test kit for testing a device under test (DUT) includes a socket structure for containing the DUT. The DUT comprises an antenna and radiates a RF signal. The test kit further includes a reflector having a lower surface. The RF signal emitted from the antenna of the DUT is reflected by the reflector and a reflected RF signal is received by the antenna of the DUT.

According to some embodiments, the test kit further includes a socket structure and a plunge structure detachable from the socket structure. The socket structure includes a socket housing, a guide plate mounted within the socket housing, and a socket base secured to the socket housing. The plunge structure includes a nest, a pressing member coupled to an upper side of the nest, a reflector coupled to a lower side of the nest. The reflector has a lower surface that prevents energy from radiating into free space.

According to some embodiments, the socket housing is made of a monolithic anti-static material.

According to some embodiments, the socket housing comprises a base portion integrated with a pin assembly.

According to some embodiments, the base portion functions as an interface between a load board and the DUT and the pin assembly comprises at least two different types and lengths of pogo pins.

According to some embodiments, the socket housing comprises an annular perimeter structure surrounding the base portion, thereby forming a cavity defined by an inner sidewall of the annular perimeter structure and an upper surface of the base portion.

According to some embodiments, the annular perimeter structure is integrally constructed with the base portion.

According to some embodiments, the annular perimeter structure has a thickness that is greater than a thickness of the base portion.

According to some embodiments, the guide plate is in direct contact with the socket housing.

According to some embodiments, the guide plate comprises a recessed structure for mounting or installing the DUT.

According to some embodiments, the guide plate comprises a recessed area at a bottom portion of the guide plate for mounting a surface-mounted device (SMD) connector of the DUT.

According to some embodiments, at a bottom surface of the recessed area on the guide plate, two rows of signal pins PS are provided for respectively connecting to RF terminals disposed at a bottom of the SMD connector.

According to some embodiments, at two opposite ends of the two rows of signal pins PS, a plurality of ground pins PG are disposed, wherein the ground pins are respectively connected to ground terminals disposed at the bottom of the SMD connector.

According to some embodiments, the guide plate comprises a first through hole and a second through hole at the bottom portion of the guide plate.

According to some embodiments, the first through hole accommodates a connector protruding from the base portion of the socket housing.

According to some embodiments, the second through hole accommodates a heat sink.

According to some embodiments, the heat sink comprises a plurality of through holes, which allow pogo pins of the pin assembly to pass therethrough.

According to some embodiments, the guide plate further comprises alignment ribs.

According to some embodiments, each of the alignment ribs has a slanted end surface.

According to some embodiments, the guide plate is made of a monolithic ESD control material or a static-dissipative material.

According to some embodiments, the socket base comprises a central through hole that allows passage of the DUT and a lower portion of the plunge structure that vacuum grips the DUT and places the DUT to test site on the socket structure.

According to some embodiments, the socket base comprises an inner portion around an upper surface of the annular perimeter structure of the socket housing, and an outer portion around the inner portion and integrally formed with the inner portion, wherein the outer portion has a thickness that is greater than a thickness of the inner portion.

According to some embodiments, the lower side of the nest is engaged and in direct contact with the inner portion of the socket base.

According to some embodiments, the nest is made of an ESD control material or a static-dissipative material.

According to some embodiments, the pressing member and the reflector are made of metal.

According to some embodiments, the lower surface of the reflector is a flat surface that is substantially in parallel with an upper surface of the DUT.

According to some embodiments, the lower surface of the reflector is a jagged surface.

According to some embodiments, the reflector is integrally constructed with the pressing member.

According to some embodiments, the nest is coupled to at least one nozzle for vacuum gripping and/or holding the DUT.

According to some embodiments, the at least one nozzle is communicate with a connecting chamber disposed between the nest and the pressing member.

According to some embodiments, the at least one nozzle is made of an ESD control material or a static-dissipative material.

Another aspect of the invention provides a test system including a device under test(DUT) comprising an antenna for radiating a RF signal; and a test kit comprising a reflector. The RF signal emitted from the antenna of the DUT is reflected by the reflector and a reflected RF signal is received by the antenna of the DUT.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DETAILED DESCRIPTION

Figure 1:
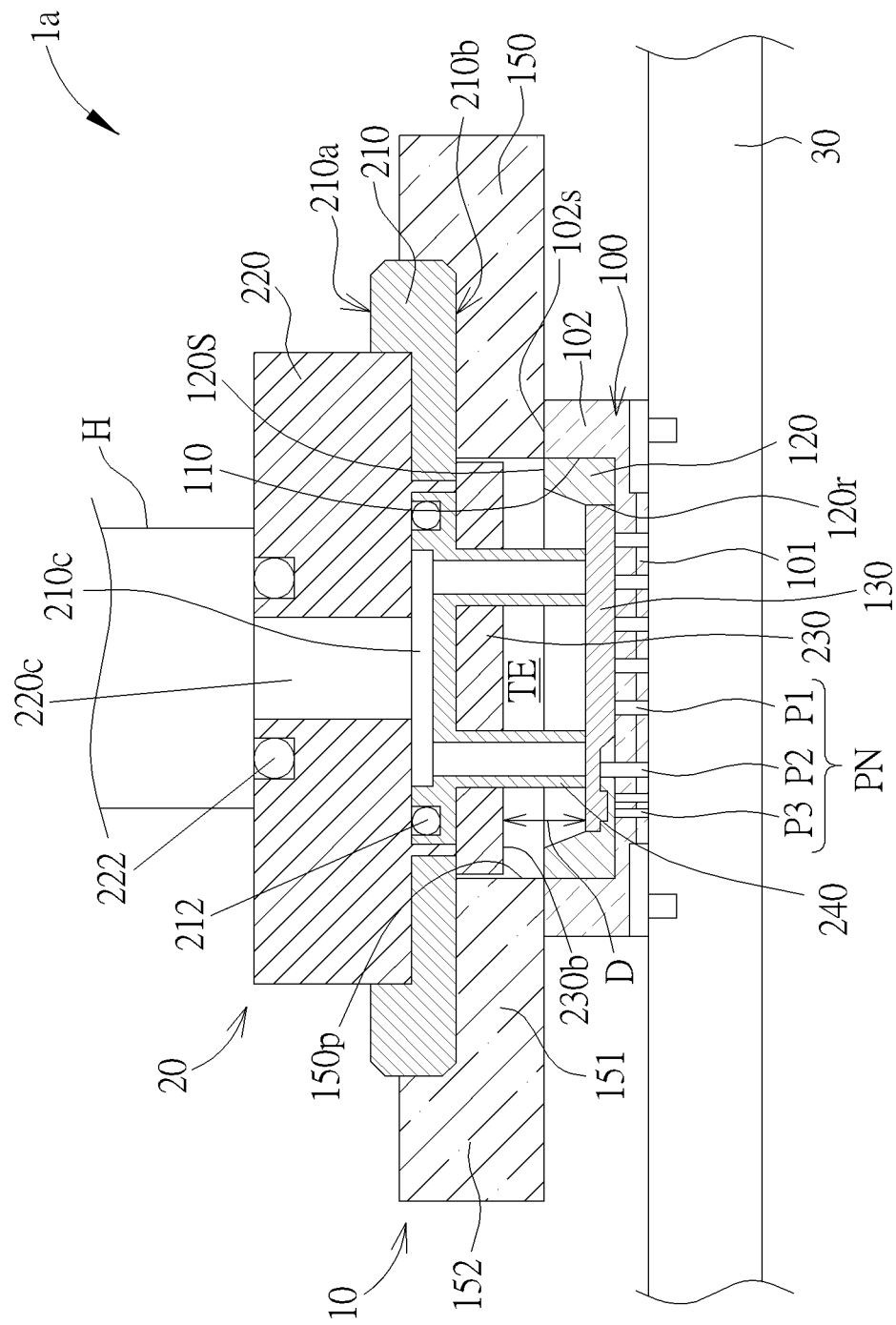
FIG. 1 is a schematic, cross-sectional diagram showing a test kit for testing a DUT according to an embodiment of the present invention.

In the following detailed description of embodiments of the invention, reference is made to the accompanying drawings, which form a part hereof, and in which is shown by way of illustration specific preferred embodiments in which the disclosure may be practiced. These embodiments are described in sufficient detail to enable those skilled in the art to practice them, and it is to be understood that other embodiments may be utilized and that mechanical, structural, and procedural changes may be made without departing from the spirit and scope of the present disclosure. The following detailed description is, therefore, not to be taken in a limiting sense, and the scope of embodiments of the present invention is defined only by the appended claims.

It will be understood that, although the terms first, second, third, primary, secondary, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first or primary element, component, region, layer or section discussed below could be termed a second or secondary element, component, region, layer or section without departing from the teachings of the present inventive concept.

Spatially relative terms, such as "beneath", "below", "lower", "under", "above," "upper," "over" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" or "over" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items, and may be abbreviated as "/".

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

It is noted that: (i) same features throughout the drawing figures will be denoted by the same reference label and are not necessarily described in detail in every drawing that they appear in, and (ii) a sequence of drawings may show different aspects of a single item, each aspect associated with various reference labels that may appear throughout the sequence, or may appear only in selected drawings of the sequence.

Wireless microelectronic devices usually undergo many kinds of tests in order to ensure sufficient performance and to verify their RF functionalities. Some tests are mandated by standards, while others are performed as part of product development and verification. When a radio frequency signal is transmitted from a transmitter to a receiver, the signal propagates in a radio channel along one or more paths having different angles of arrivals, signal delays, polarizations and powers, which cause fading of different durations and strengths in the received signal. In addition, noise and interference due to other transmitters interfere with the radio connection.

The present invention pertains to a wireless test system for testing microelectronic devices or modules with antennas. Embodiments of the present invention are directed to improvements in test kits utilized to hold and/or test a device under test (DUT). For example, a method of testing a DUT may include setting the DUT in a simultaneous transmit and receive mode; receiving a lower frequency radio frequency (RF) signal from a test unit; up-converting the lower frequency RF signal to a higher frequency RF signal; transmitting the higher frequency RF signal using a first antenna of the DUT; receiving the higher frequency RF signal using a second antenna of the DUT; down-converting the received higher frequency RF signal to a received test RF signal; and providing the received test RF signal to the test unit.

A DUT is a term commonly used to refer to any electronic device or module undergoing any testing. The DUT is usually inserted into a test socket that is connected to an automatic test equipment (ATE) in semiconductor testing. An ATE is widely used in the manufacturing industry to test the various types of semiconductor devices such as packaged or un-packaged integrated circuit (IC) devices, antenna-in modules (AIMs), printed circuit boards (PCBs), etc.

The present disclosure is particularly suited for radiated testing of an RF microelectronic device or DUT that has an integrated mmW antenna structure. The integrated antenna structure may have multiple elements in an array design that may be driven and/or sensed by integrated RF transmitter and/or receiver circuitry. The integrated antenna structure may operate or have a radiation pattern in the range of, for example, 20 GHz to 300 GHz (millimeter wave frequencies). For example, the antenna structure may operate in a frequency band around 24 GHz, 60 GHz, 77 GHz, or 79 GHz, but is not limited thereto.

In a non-limiting example, the configuration depicted through the figures may be applicable to the wireless testing of a DUT comprising a transmitter that may produce electromagnetic waves in the radio or microwaves domain, a transmitting antenna, a receiving antenna, a receiver, and a processor.

Please refer to FIG. 1. FIG. 1 is a schematic, cross-sectional diagram showing a test kit for testing a DUT according to an embodiment of the present invention. As shown in FIG. 1, the test kit 1a comprises a socket structure 10 and a plunge structure 20 detachable from the socket structure 10. According to an embodiment of the present invention, the socket structure 10 may comprise a socket housing 100 secured to a load board 30 such as a printed wiring board or a printed circuit board. The load board 30 may also be referred to as a test board. Although not explicitly depicted, it is understood that the load board 30 typically comprises a core (e.g., FR4 copper clad laminate core), a plurality of dielectric build-up layers, and traces on opposite surfaces of the core. The traces in different levels of the printed circuit board may be electrically connected to one another by plated through vias or plated through holes. The circuitry on the load board 30 may be electrically connected to a test unit (not shown) comprising a signal generator configured to generate a test signal.

According to an embodiment of the present invention, the load board 30 may incorporate custom circuitry specific for testing a particular DUT. For example, the load board 30 may be a custom RF load board that has been modified especially for the radiative, electrical and physical characteristics of a particular DUT. According to an embodiment of the present invention, for example, the load board 30 may be electrically connected to an RF instrumentation circuitry by RF cables and/or connectors (not shown). It is understood that the load board 30 may also be connected to DC power, ground, digital inputs/outputs, and/or a computer, which are not shown for the sake of simplicity.

According to an embodiment of the present invention, the socket housing 100 may be made of monolithic anti-static materials including, but not limited to, durable high-performance polyimide-based plastics, such as SP1+(DuPont™) having a dielectric constant ($D_k$) of about 3.5, but is not limited thereto. According to an embodiment of the present invention, the socket housing 100 may comprise a plate-shaped base portion 101 integrated with a pin assembly PN including, but not limited to, pogo pins P1, conductive pins P2 and conductive pins P3. The conductive pins P2 and P3 may extend from the socket housing 100 and penetrate through corresponding through holes formed on the base portion 101 for transmitting signals. According to an embodiment of the present invention, the base portion 101 functions as an interface between the load board 30 and a DUT and the pin assembly PN may comprise at least two different types and lengths of pogo pins.

According to an embodiment of the present invention, the socket housing 100 may comprises an annular perimeter structure 102 surrounding the base portion 101, thereby forming a cavity 110 defined by an inner sidewall of the annular perimeter structure 102 and an upper surface of the base portion 101. According to an embodiment of the present invention, the annular perimeter structure 102 is formed integrally with the base portion 101. According to an embodiment of the present invention, the annular perimeter structure 102 has a thickness that is greater than a thickness of the base portion 101. According to another embodiment of the present invention, the socket housing 100 could be directly contacted with the load board 30. However, the socket housing 100 could be partially removed while the socket housing 100 is overlapping any high frequency signal traces on the load board 30.

According to an embodiment of the present invention, a floating guide plate 120 for guiding and adjusting the position and/or rotation angles of a DUT may be fittingly mounted within the cavity 110. The guide plate 120 may be in direct contact with the socket housing 100. According to an embodiment of the present invention, after mounting the guide plate 120 into the cavity 110, an upper surface 120S of the guide plate 120 may be slightly lower than an upper surface 102S of the annular perimeter structure 102 of the socket housing 100. According to another embodiment of the present invention, after mounting the guide plate 120 into the cavity 110, the upper surface 120S of the guide plate 120 may be coplanar with the upper surface 102S of the annular perimeter structure 102 of the socket housing 100.

Figure 2:
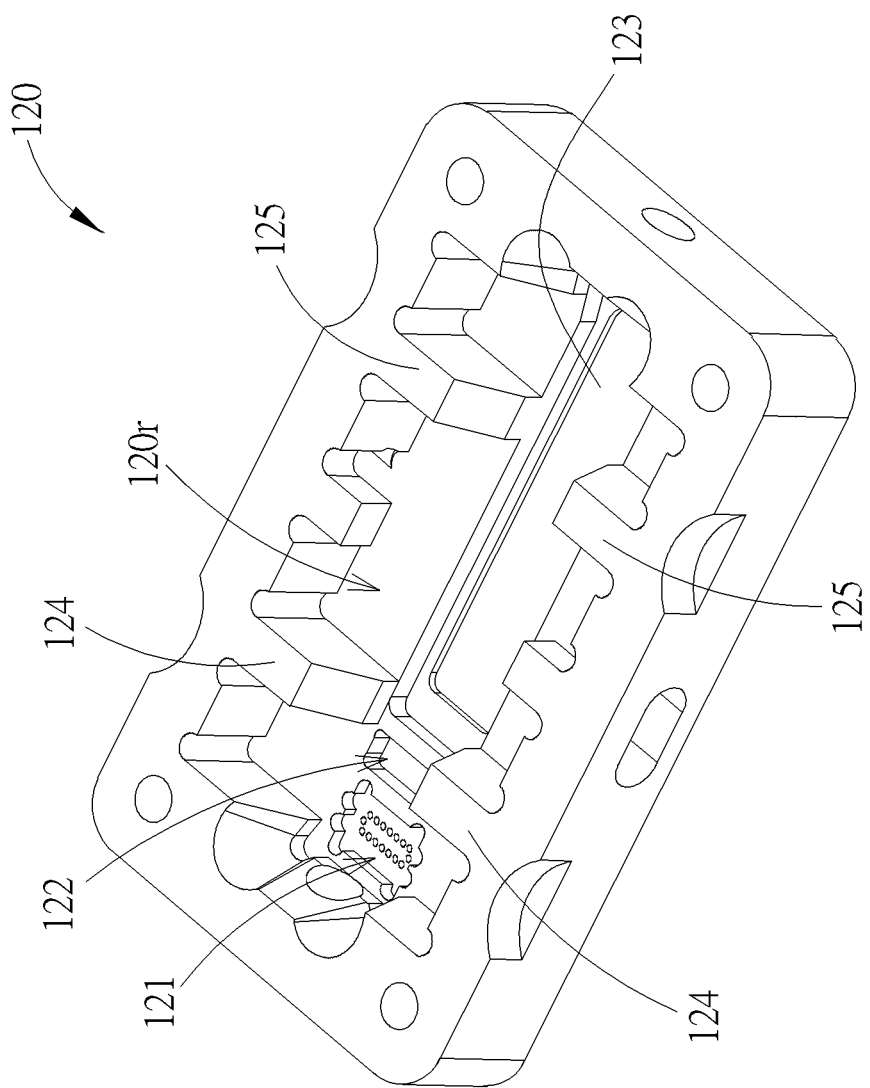
FIG. 2 is a perspective view showing an exemplary guide plate according to an embodiment of the invention.
Figure 3:
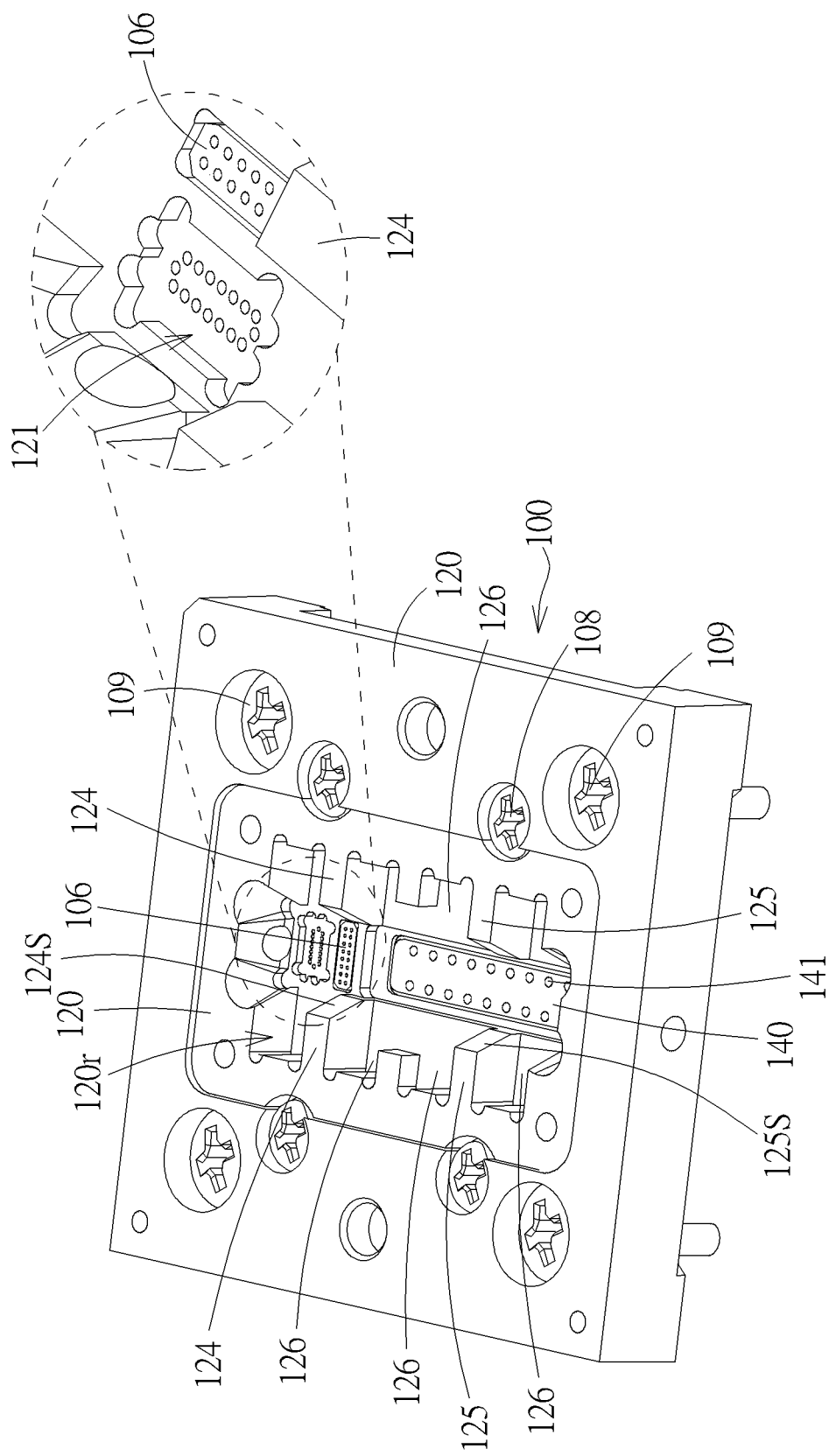
FIG. 3 is a perspective view of an exemplary socket housing installed with a guide plate according to an embodiment of the invention.
Figure 4:
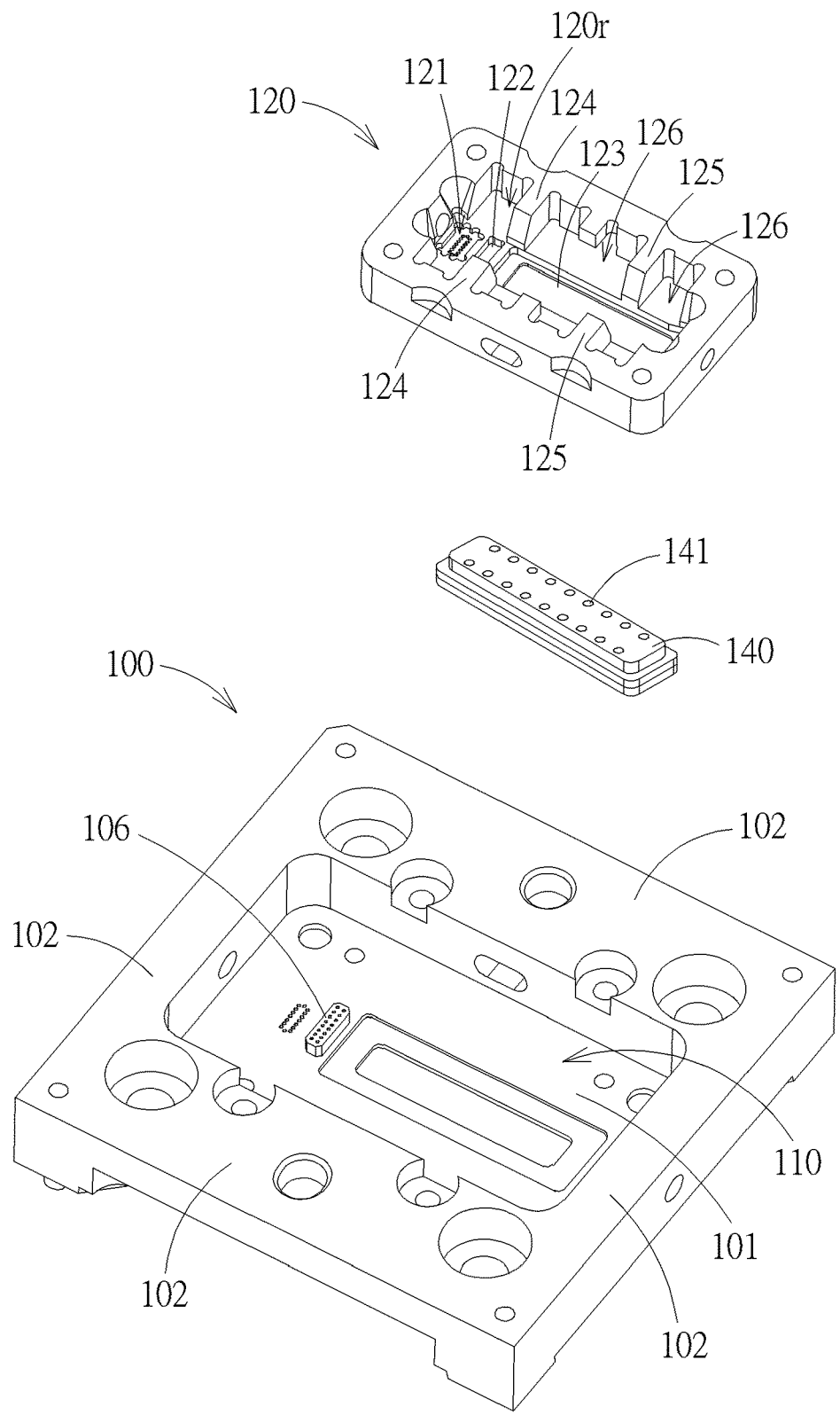
FIG. 4 is an exploded diagram showing the exemplary socket housing, the guide plate and the heat sink in FIG. 3.

Please also refer to FIG. 2 to FIG. 4. FIG. 2 is a perspective view showing an exemplary guide plate according to an embodiment of the invention. FIG. 3 is a perspective view of an exemplary socket housing installed with a guide plate according to an embodiment of the invention. FIG. 4 is an exploded diagram showing the exemplary socket housing, the exemplary guide plate and an exemplary heat sink in FIG. 3. As shown in FIG. 2 to FIG. 4, and briefly to FIG. 1, the guide plate 120 may comprise a recessed structure 120r for mounting or installing a DUT 130 (FIG. 1) such as a chip module with antennas. At the bottom portion of the guide plate 120, a recessed area 121 is provided for mounting a surface-mounted device (SMD) connector (not explicitly shown in FIG. 1 and FIG. 2) of the DUT 130. The details of the SMD connector will be described later.

According to an embodiment of the present invention, a first through hole 122 and a second through hole 123 may be provided at the bottom portion of the guide plate 120. According to an embodiment of the present invention, for example, the first through hole 122 may be used to accommodate a connector 106 protruding from the base portion 101 of the socket housing 100. According to an embodiment of the present invention, for example, the connector 106 protruding from the base portion 101 of the socket housing 100 may extend upwardly through the first through hole 122. According to an embodiment of the present invention, for example, the second through hole 123 may be used to accommodate a heat sink 140 that is made of high heat-dissipating materials. The heat sink 140 comprises a plurality of through holes 141, which allow the pogo pins P1 to pass therethrough, such that the pogo pins P1 are able to contact corresponding terminals on the DUT 130. The heat generated by the DUT 130 during the testing process may be dissipated through the pogo pins P1 and the heat sink 140 to the load board 30. The heat sink 140 improves the cooling ability for high power devices and stabilizes the testing results.

According to an embodiment of the present invention, the guide plate 120 further comprises two pairs of alignment ribs 124 and 125. According to an embodiment of the present invention, for example, the pair of alignment ribs 124 may be disposed between the first through hole 122 and the second through hole 123. According to an embodiment of the present invention, for example, the pair of alignment ribs 125 may be disposed adjacent to the heat sink 140. According to an embodiment of the present invention, for example, each of the alignment ribs 124 may have a slanted end surface 124S and each of the alignment ribs 125 may have a slanted end surface 125S for guiding the DUT 130 when the DUT 130 is mounted onto the guide plate 120. The air space (or compartments) 126 between the alignment ribs 124, 125 and the DUT 130 can minimize the adverse effects of the dielectric material during the testing process. By removing unnecessary dielectric body from the guide plate 120, the dielectric effect on the antenna radiation pattern is mitigated and the measurement stability can be improved.

According to an embodiment of the present invention, for example, the guide plate 120 may be fastened and secured to the socket housing 100 by using screws 108, more specifically, by a peripheral head portion of each of the four exemplary screws 108. According to an embodiment of the present invention, the screws 108 may be made of non-conductive materials such as engineering plastics, but is not limited thereto. According to an embodiment of the present invention, the socket housing 100 may be fastened or secured to the load board 30 by using screws 109, but not limited thereto.

According to an embodiment of the present invention, the guide plate 120 may be made of monolithic electrostatic-discharge (ESD) control materials or static-dissipative materials to prevent the DUT 130 from being damaged under high electrostatic voltages during the testing process. For example, the aforesaid ESD control materials or static-dissipative materials may include, but not limited to, polyether ether ketone (PEEK)-based plastics, such as EKH-SS11 (Krefine®) having a dielectric constant of about 5.3. A static-dissipative material is defined as a material having a surface resistance (SR) from $1\times10^5$ ohm to $1\times10^{11}$ ohm as defined by the International Electro-technical Commission (IEC) 61340-5-1. A static-dissipative material is difficult to charge and its charge transfer speed is not high making it an ideal material for ESD sensitive applications.

Figure 5:
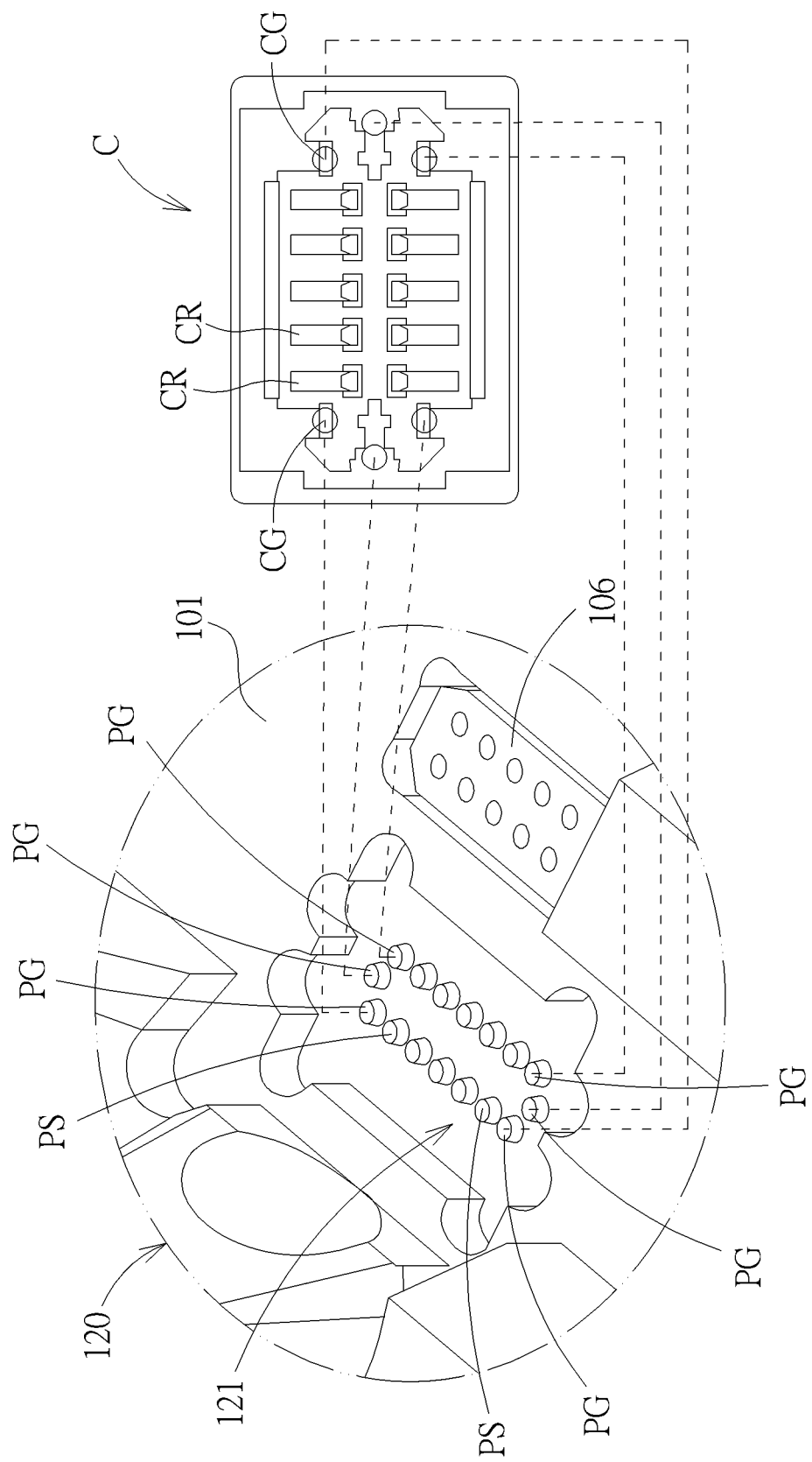
FIG. 5 is a schematic diagram showing a bottom view of a SMD connector and the recessed area on the guide plate for mounting the SMD connector according to an embodiment of the invention.

Please refer to FIG. 5. FIG. 5 is a schematic diagram showing a bottom view of a SMD connector C of the DUT 130 and the recessed area 121 on the guide plate 120 for mounting the SMD connector C according to an embodiment of the invention. As shown in FIG. 5, at a bottom surface of the recessed area 121 on the guide plate 120, two rows of signal pins PS may be provided. The signal pins PS are respectively connected to RF terminals (or RF pins) CR disposed at the bottom of the SMD connector C. At two opposite ends of the two rows of signal pins PS, a plurality of ground pins PG are disposed. The ground pins PG are respectively connected to ground terminals (or ground pins) CG disposed at the bottom of the SMD connector C. The additional ground pins PG are used to improve the signal integrity and alignment accuracy. According to an embodiment of the present invention, each of the signal pins PS and the ground pins PG may be a blunt round tipped pogo pin, which can prevent the coating of the device surface from being scratched.

Referring back to FIG. 1, the socket structure 10 may further comprise an annular socket base 150 for precision plunger alignment. According to an embodiment of the present invention, the socket base 150 is mounted and secured on the upper surface 102S of the annular perimeter structure 102 of the socket housing 100. According to an embodiment of the present invention, the socket base 150 comprises a central through hole 150p that allows the passage of the DUT 130 and a lower portion of the plunge structure 20 that vacuum grips the DUT 130 and places the DUT 130 to the test site on the socket structure 10. According to an embodiment of the present invention, the socket base 150 may comprise an inner portion 151 around the upper surface 102S of the annular perimeter structure 102 of the socket housing 100, and an outer portion 152 around the inner portion 151 and integrally formed with the inner portion 151. According to an embodiment of the present invention, the outer portion 152 has a thickness that is greater than a thickness of the inner portion 151. According to an embodiment of the present invention, the socket base 150 may be made of monolithic anti-static materials including, but not limited to, anti-static FR4 having a dielectric constant of about 4.37, but is not limited thereto.

As shown in FIG. 1, the plunge structure 20 comprises a nest 210. According to an embodiment of the present invention, the nest 210 may be made of ESD control materials or static-dissipative materials including, but not limited to, PEEK having a dielectric constant of about 3.3, but is not limited thereto. According to an embodiment of the present invention, the nest 210 has an upper side 210a and a lower side 210b. During the testing process, the lower side 210b of the nest 210 is engaged and in direct contact with the inner portion 151 of the socket base 150. According to an embodiment of the present invention, a pressing member 220 may be coupled to the upper side 210a of the nest 210. According to an embodiment of the present invention, the pressing member 220 may be made of metal, but is not limited thereto. The pressing member 220 locks the nest 210 to layout kit part. According to an embodiment of the present invention, the pressing member 220 may be coupled to a robot arm or a handler H.

Figure 6:
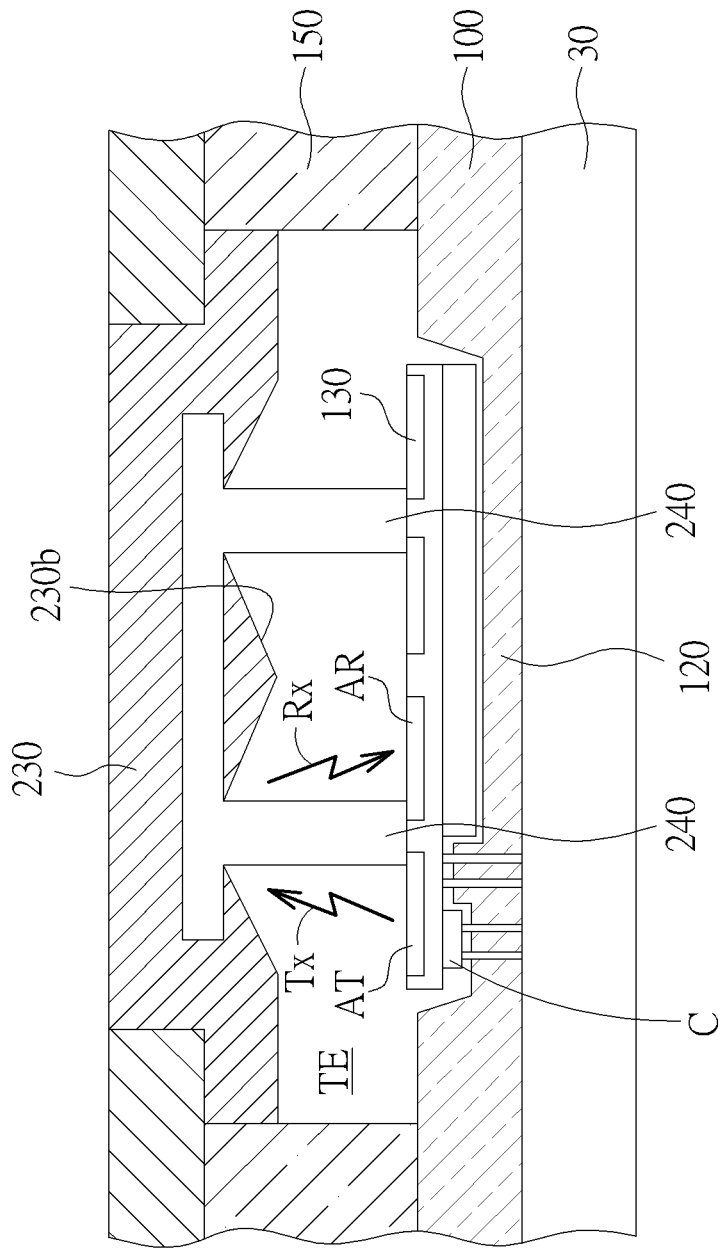
FIG. 6 shows a jagged surface of the reflector according to another embodiment of the invention.

According to an embodiment of the present invention, a reflector 230 may be coupled to the lower side 210b of the nest 210. According to an embodiment of the present invention, the reflector 230 may be made of metal such as brass or any suitable material that is able to reflect electromagnetic radiation such as RF signals emitted from the DUT 130. The reflector 230 provides a reflecting plane formed by the lower surface 230b that prevents energy from radiating into free space. According to an embodiment of the present invention, the lower surface 230b may be a flat surface that is substantially in parallel with the upper surface of the DUT 130. According to another embodiment of the present invention, the lower surface 230b may be a jagged surface, as shown in FIG. 6. In FIG. 6, the RF signal Tx emitted from the antenna AT of the DUT 130 is reflected by the jagged surface 230b of the reflector 230 and the reflected RF signal Rx is received by the antenna AR of the DUT 130. The measurement is performed by the ATE.

According to an embodiment of the present invention, the reflector 230 may be formed integrally with the pressing member 220, but is not limited thereto. According to an embodiment of the present invention, the nest 210 may be sandwiched by the pressing member 220 and the reflector 230.

According to an embodiment of the present invention, the nest 210 is coupled to at least one nozzle 240 for vacuum gripping and/or holding the DUT 130 in the guide plate 120 mounted in the socket housing 100. For illustration purposes, two nozzles 240 are illustrated in FIG. 1. According to an embodiment of the present invention, for example, the nozzle 240 may be made of ESD control materials or static-dissipative materials including, but not limited to, ESD420 having a dielectric constant of about 5.63, but is not limited thereto. According to an embodiment of the present invention, the nozzles 240 may be used to pick and place the DUT 130 in the socket structure 10. According to an embodiment of the present invention, the nozzles 240 may be used to press the DUT 130 in position during the testing process. According to an embodiment of the present invention, the nozzles 240 may be used to provide coupling factor tuning with different shapes and sizes.

According to an embodiment of the present invention, the nozzles 240 may communicate with a connecting chamber 210c between the nest 210 and the pressing member 220, which is further connected to a vacuum conduit 220c. According to an embodiment of the present invention, for example, a vacuum seal 222 such as a rubber O-ring may be provided around the vacuum conduit 220c and a vacuum seal 212 such as a rubber O-ring may be provided around the connecting chamber 210c. According to an embodiment of the present invention, for example, the vacuum seal 212 and the vacuum seal 222 may be made of heat-resistance materials.

During the testing process, a testing enclosure TE is defined approximately between the lower surface 230b of the reflector 230, the perimeter sidewall of the central through hole 150p of the socket base 150, and the guide plate 120. The previously mentioned test method for testing the DUT 130 may be implemented within the testing enclosure TE. A vertical distance between the lower surface 230b of the reflector 230 and the antenna (not explicitly shown) of the DUT 130 is defined as a reflection distance D that can be adjusted in order to control the receiving energy and keep impedance matching. According to an embodiment of the present invention, for example, the reflection distance D may preferably range between about $0.25\lambda$ and multiple of this length, wherein $\lambda$ is the wavelength (mm) of the RF signal with the lowest frequency in operation band. For example, for the RF signal with frequency of 24.5 GHz, $\lambda$ is 12.4 mm, and therefore the reflection distance D ranges between 3.1 mm and 9.3 mm.

It is advantageous to use the present invention because the antenna coupling factor can be significantly improved while the antenna s11 can be maintained. The antenna coupling factor may be the same polarization or different polarizations. The operation band may be single band or multi-band.

Figure 7:
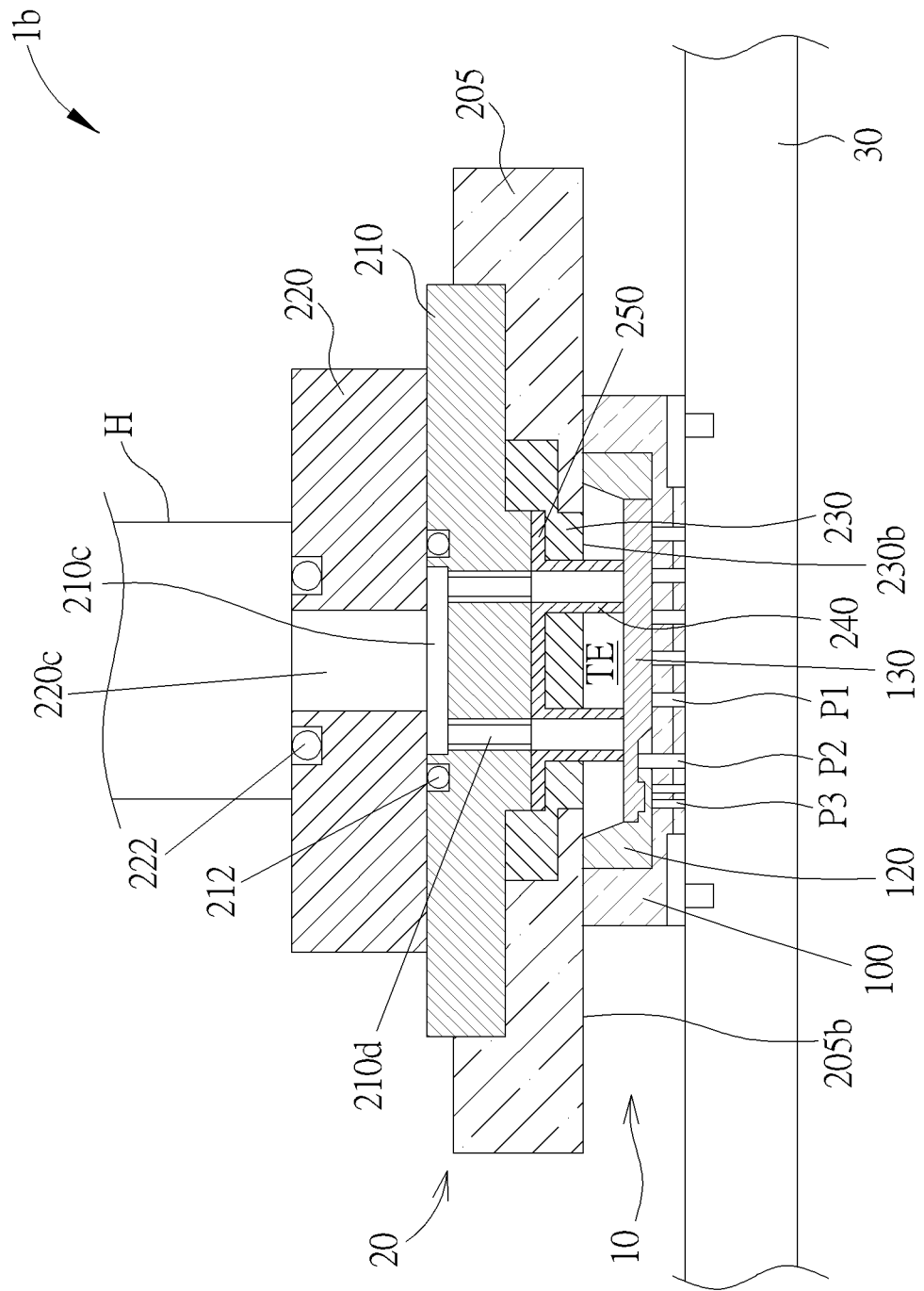
FIG. 7 is a schematic, cross-sectional diagram showing a test kit utilizing a plunge structure having a dual-nest configuration according to another embodiment of the invention.

FIG. 7 is a schematic, cross-sectional diagram showing a test kit 1b utilizing a plunge structure having a dual-nest configuration according to another embodiment of the invention, wherein like regions, elements or layers are designated by like numeral numbers. As shown in FIG. 7, the socket base 150 as depicted in FIG. 1 is omitted from the socket structure 10. Instead, the plunge structure 20 comprises a base portion 205 that may be fastened or secured to the nest 210 that is coupled to the pressing member 220.

According to an embodiment of the present invention, the nest 210 may be made of metal such as brass, which is different form the embodiment depicted in FIG. 1. The metal nest 210 can block electromagnetic wave that escapes away from the nozzles 240. According to an embodiment of the present invention, the nest 210 may drilled holes 210d respectively communicating with the nozzles 240. To reduce the leakage of electromagnetic wave, the diameter of each of the drilled holes 210d is smaller than that of the nozzles 240. The diameter of each of the drilled holes 210d is designed not to support any propagating modes in it, thereby improving the coupling between antennas on the DUT 130.

According to an embodiment of the present invention, the base portion 205 may be made of monolithic anti-static materials including, but not limited to, anti-static FR4 having a dielectric constant of about 4.37, but is not limited thereto. A nest 250, which may be made of, for example, PEEK, may be provided between the reflector 230 and the nest 210. According to an embodiment of the present invention, the nest 250 may be secured to the nest 210 with screws, but not limited thereto.

According to an embodiment of the present invention, the nest 250 may be integrally formed with the nozzles 240 for vacuum gripping or holding the DUT 130. The loss tangent of the material of the nozzles 240 is as small as possible to maximize the coupling between the antennas of the DUT 130. According to an embodiment of the present invention, the lower surface 230b of the reflector 230 may be flush with the lower surface 205b of the base portion 205. The testing enclosure TE is defined approximately between the lower surface 230b of the reflector 230, the perimeter sidewall of the guide plate 120 and the upper surface of the DUT 130. The previously mentioned test method for testing the DUT 130 may be implemented within the testing enclosure TE.

Figure 8:
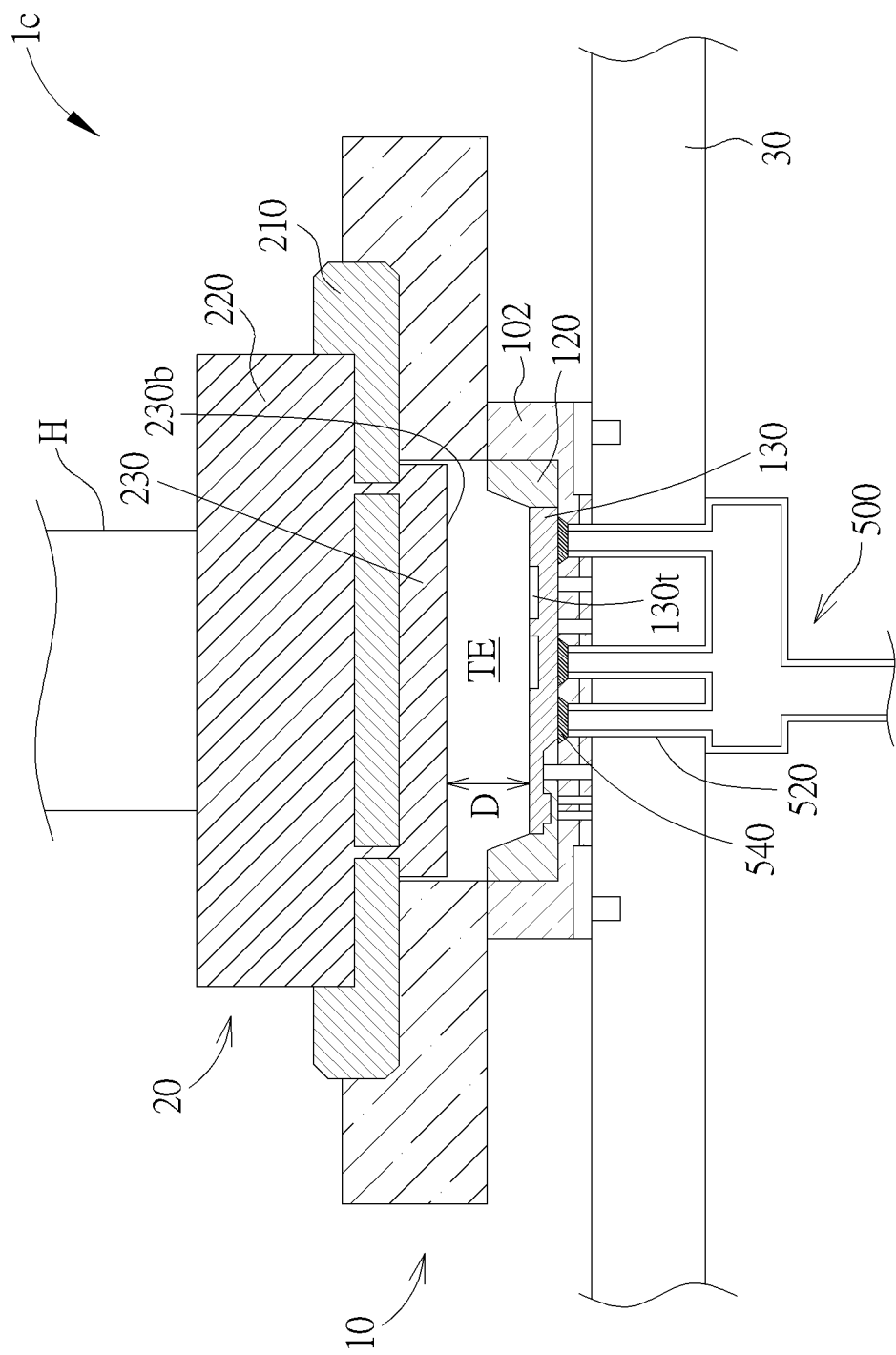
FIG. 8 is a schematic, cross-sectional diagram showing a test kit according to still another embodiment of the invention.

FIG. 8 is a schematic, cross-sectional diagram showing a test kit 1c according to still another embodiment of the invention, wherein like regions, elements or layers are designated by like numeral numbers. As shown in FIG. 8, a vacuum system 500 may be integrated with the load board 30. According to an embodiment of the present invention, the vacuum system 500 may comprise a plurality of vacuum tubes 520 that penetrate through the load board 30 for vacuum gripping or holding the DUT 130. According to an embodiment of the present invention, each of the vacuum tubes 520 may comprise a nozzle 540 that is in direct contact with the DUT 130 during the testing process. According to an embodiment of the present invention, nozzle 540 may be made of ESD control materials or static-dissipative materials including, but not limited to, ESD420 having a dielectric constant of about 5.63, but is not limited thereto. During the testing process, a testing enclosure TE is defined approximately between the lower surface 230b of the reflector 230, the perimeter sidewall of the central through hole 150p of the socket base 150, and the guide plate 120. The previously mentioned test method for testing the DUT 130 may be implemented within the testing enclosure TE. The reflection distance D between the lower surface 230b of the reflector 230 and the antenna 130t of the DUT 130 can be adjusted in order to control the receiving energy and keep impedance matching. According to an embodiment of the present invention, for example, the reflection distance D may preferably range between about 0.25λ and about 0.75λ, wherein λ is the wavelength (mm) of the RF signal with the lowest frequency in operation band. For example, for the RF signal with frequency of 24.5 GHz, λ is 12.4 mm, and therefore the reflection distance D ranges between 3.1 mm and 9.3 mm.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A test kit for testing a device under test (DUT), comprising:
    a socket structure, for containing the DUT, wherein the DUT comprises an antenna and radiates a RF signal, wherein the socket structure comprising a socket housing, a guide plate mounted within the socket housing, and a socket base secured to the socket housing;
    a plunge structure detachable from the socket structure, wherein the plunge structure comprises a nest, a pressing member coupled to an upper side of the nest; and
    a reflector comprising a lower surface, wherein the reflector is coupled to a lower side of the nest, wherein the RF signal emitted from the antenna of the DUT is reflected by the reflector and a reflected RF signal is received by the antenna of the DUT, wherein a testing enclosure is defined between the lower surface of the reflector and the DUT.

2. The test kit for testing a DUT according to claim 1, wherein the socket housing is made of a monolithic anti-static material.

3. The test kit for testing a DUT according to claim 1, wherein the socket housing comprises a base portion integrated with a pin assembly.

4. The test kit for testing a DUT according to claim 3, wherein the base portion functions as an interface between a load board and the DUT and the pin assembly comprises at least two different types and lengths of pogo pins.

5. The test kit for testing a DUT according to claim 3, wherein the socket housing comprises an annular perimeter structure surrounding the base portion, thereby forming a cavity defined by an inner sidewall of the annular perimeter structure and an upper surface of the base portion.

6. The test kit for testing a DUT according to claim 4, wherein the annular perimeter structure is integrally constructed with the base portion.

7. The test kit for testing a DUT according to claim 1, wherein the guide plate is in direct contact with the socket housing.

8. The test kit for testing a DUT according to claim 1, wherein the guide plate comprises a recessed structure for mounting or installing the DUT.

9. The test kit for testing a DUT according to claim 3, wherein the guide plate comprises a recessed area at a bottom portion of the guide plate for mounting a surface-mounted device (SMD) connector of the DUT.

10. The test kit for testing a DUT according to claim 9, wherein at a bottom surface of the recessed area on the guide plate, two rows of signal pins are provided for respectively connecting to RF terminals disposed at a bottom of the SMD connector.

11. The test kit for testing a DUT according to claim 10, wherein at two opposite ends of the two rows of signal pins, a plurality of ground pins are disposed, wherein the ground pins are respectively connected to ground terminals disposed at the bottom of the SMD connector.

12. The test kit for testing a DUT according to claim 9, wherein the guide plate comprises a first through hole and a second through hole at the bottom portion of the guide plate.

13. The test kit for testing a DUT according to claim 12, wherein the first through hole accommodates a connector protruding from the base portion of the socket housing.

14. The test kit for testing a DUT according to claim 12, wherein the second through hole accommodates a heat sink.

15. The test kit for testing a DUT according to claim 14, wherein the heat sink comprises a plurality of through holes, which allow pogo pins of the pin assembly to pass therethrough.

16. The test kit for testing a DUT according to claim 1, wherein the guide plate further comprises alignment ribs.

17. The test kit for testing a DUT according to claim 16, wherein each of the alignment ribs has a slanted end surface.

18. The test kit for testing a DUT according to claim 1, wherein the guide plate is made of a monolithic ESD control material or a static-dissipative material.

19. The test kit for testing a DUT according to claim 1, wherein the socket base comprises a central through hole that allows passage of the DUT and a lower portion of the plunge structure that vacuum grips the DUT and places the DUT to test site on the socket structure.

20. The test kit for testing a DUT according to claim 5, wherein the socket base comprises an inner portion around an upper surface of the annular perimeter structure of the socket housing, and an outer portion around the inner portion and integrally formed with the inner portion.

21. The test kit for testing a DUT according to claim 20, wherein the lower side of the nest is engaged and in direct contact with the inner portion of the socket base.

22. The test kit for testing a DUT according to claim 1, wherein the nest is made of an ESD control material or a static-dissipative material.

23. The test kit for testing a DUT according to claim 1, wherein the pressing member and the reflector are made of metal.

24. The test kit for testing a DUT according to claim 1, wherein the lower surface of the reflector is a flat surface that is substantially in parallel with an upper surface of the DUT.

25. The test kit for testing a DUT according to claim 1, wherein the lower surface of the reflector is a jagged surface.

26. The test kit for testing a DUT according to claim 1, wherein the reflector is integrally constructed with the pressing member.

27. The test kit for testing a DUT according to claim 1, wherein the nest is coupled to at least one nozzle for vacuum gripping or holding the DUT.

28. The test kit for testing a DUT according to claim 27, wherein the at least one nozzle communicates with a connecting chamber disposed between the nest and the pressing member.

29. The test kit for testing a DUT according to claim 27, wherein the at least one nozzle is made of an ESD control material or a static-dissipative material.

30. A test system, comprising:
   a device under test(DUT), comprising an antenna for radiating a RF signal; and
   a test kit according to claim 1.

* * * * *